United States Patent
Chin et al.

(10) Patent No.: US 11,600,358 B2
(45) Date of Patent: Mar. 7, 2023

(54) TEMPERATURE MANAGEMENT OF MEMORY ELEMENTS OF AN INFORMATION HANDLING SYSTEM

(71) Applicant: Dell Products L.P., Round Rock, TX (US)

(72) Inventors: Jordan Chin, Austin, TX (US); Isaac Qin Wang, Austin, TX (US)

(73) Assignee: Dell Products L.P., Round Rock, TX (US)

(*) Notice: Subject to any disclaimer, the term of this patent is extended or adjusted under 35 U.S.C. 154(b) by 0 days.

(21) Appl. No.: 17/365,095

(22) Filed: Jul. 1, 2021

(65) Prior Publication Data
US 2023/0005564 A1 Jan. 5, 2023

(51) Int. Cl.
G06F 11/30 (2006.01)
G11C 29/52 (2006.01)
G11C 5/14 (2006.01)
G11C 29/44 (2006.01)

(52) U.S. Cl.
CPC .......... *G11C 29/52* (2013.01); *G06F 11/3058* (2013.01); *G11C 5/147* (2013.01); *G11C 29/44* (2013.01)

(58) Field of Classification Search
CPC ......... G11C 29/52; G11C 5/147; G11C 29/44; G06F 11/3058
USPC .......................................................... 714/1
See application file for complete search history.

(56) References Cited

U.S. PATENT DOCUMENTS

| | | | | |
|---|---|---|---|---|
| 6,105,146 A * | 8/2000 | Tavallaei | ............ | G06F 11/0751 714/6.32 |
| 6,115,713 A * | 9/2000 | Pascucci | .................... | G06F 9/54 |
| 2004/0221142 A1* | 11/2004 | Beckert | .................... | G06F 12/08 714/1 |
| 2007/0033431 A1* | 2/2007 | Pecone | ..................... | G06F 1/28 714/6.12 |
| 2013/0135941 A1* | 5/2013 | Reohr | ................. | G11C 11/4072 365/189.11 |
| 2016/0125921 A1* | 5/2016 | Kambegawa | ....... | G06F 11/0733 711/106 |
| 2020/0174882 A1* | 6/2020 | Kim | .................. | G11C 11/40603 |
| 2020/0258566 A1* | 8/2020 | Schaefer | ............. | G11C 11/2275 |

\* cited by examiner

*Primary Examiner* — Kyle Vallecillo
*Assistant Examiner* — Enam Ahmed
(74) *Attorney, Agent, or Firm* — McDermott Will & Emery LLP

(57) ABSTRACT

Managing a temperature of a memory element of an information handling system, the method comprising: identifying a lower temperature boundary of the memory element; determining an initial temperature of the memory element; determining whether the initial temperature is less than the lower temperature boundary; in response to determining that the initial temperature is less than the lower temperature boundary: performing a series of repeated burst refresh operations at the memory element; after performing the series of repeated burst refreshes operations, determining an updated temperature of memory element; determining whether the updated temperature is less than the lower temperature boundary; and in response to determining that the updated temperature is greater than the lower temperature boundary, performing a normal boot of the memory element.

18 Claims, 4 Drawing Sheets

TEMPERATURE MANAGEMENT OF MEMORY ELEMENTS OF AN INFORMATION HANDLING SYSTEM

BACKGROUND

Field of the Disclosure

The disclosure relates generally to an information handling system, and in particular, temperature management of memory elements of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

The effect of temperature, especially at sub-zero conditions, has a huge impact on memory element operations. Memory elements can compose of multiple layers of dense metal interconnects. The velocity of electron movement varies drastically under different temperatures. As the temperature decreases, so does the effective resistance of the interconnects. At this level, all digital signals behave like analog signals and some signals can go faster than others. This can cause internal race conditions, where a signal arrives sooner than it was supposed to, which then causes incorrect/invalid transitions/transactions (data integrity problem).

SUMMARY

Innovative aspects of the subject matter described in this specification may be embodied in a method of managing a temperature of a memory element of an information handling system, the method including: identifying a lower temperature boundary of the memory element; determining an initial temperature of the memory element; determining whether the initial temperature is less than the lower temperature boundary; in response to determining that the initial temperature is less than the lower temperature boundary: performing a series of repeated burst refresh operations at the memory element; after performing the series of repeated burst refreshes operations, determining an updated temperature of memory element; determining whether the updated temperature is less than the lower temperature boundary; and in response to determining that the updated temperature is greater than the lower temperature boundary, performing a normal boot of the memory element.

Other embodiments of these aspects include corresponding systems, apparatus, and computer programs, configured to perform the actions of the methods, encoded on computer storage devices.

These and other embodiments may each optionally include one or more of the following features. For instance, in response to determining that that initial temperature is greater than the lower temperature boundary, performing the normal boot of the memory element. Further in response to determining that the initial temperature is less than the lower temperature boundary: increasing an input voltage to the memory element to a maximum rating; and enabling a power management integrated controller based on the increased input voltage. Further in response to determining that the updated temperature is greater than the lower temperature boundary: resetting the voltage to the memory element to a default rating of the memory element. Further in response to determining that the initial temperature is less than the lower temperature boundary: performing an initialization of the memory element. Further in response to determining that the initial temperature is less than the lower temperature boundary: in response to determining that the updated temperature is less than the lower temperature boundary, determining whether the updated temperature is greater than the initial temperature; and in response to determining that the updated temperature is greater than the initial temperature, performing the series of repeated burst refreshes operations at the memory element a second time. Further in response to determining that the initial temperature is less than the lower temperature boundary: in response to determining that the updated temperature is less than the lower temperature boundary, determining whether the updated temperature is greater than the initial temperature; and in response to determining that the updated temperature is the same as the initial temperature, performing a series of repeated interleaving activate, read, auto pre-charge operations at the memory element. Further in response to determining that the updated temperature is the same as the initial temperature: determining a current temperature of the memory element; determining whether the current temperature is less than the lower temperature boundary; and in response to determining that the current temperature is greater than the lower temperature boundary, performing the normal boot of the memory element. In response to determining that the current temperature is less than the lower temperature boundary, provide a notification indicating a failed status of memory element.

Particular implementations of the subject matter described in this specification can be implemented so as to realize one or more of the following advantages. For example, memory modules may be utilized beyond typical temperature ranges.

The details of one or more embodiments of the subject matter described in this specification are set forth in the accompanying drawings and the description below. Other potential features, aspects, and advantages of the subject matter will become apparent from the description, the drawings, and the claims.

Figure 1:
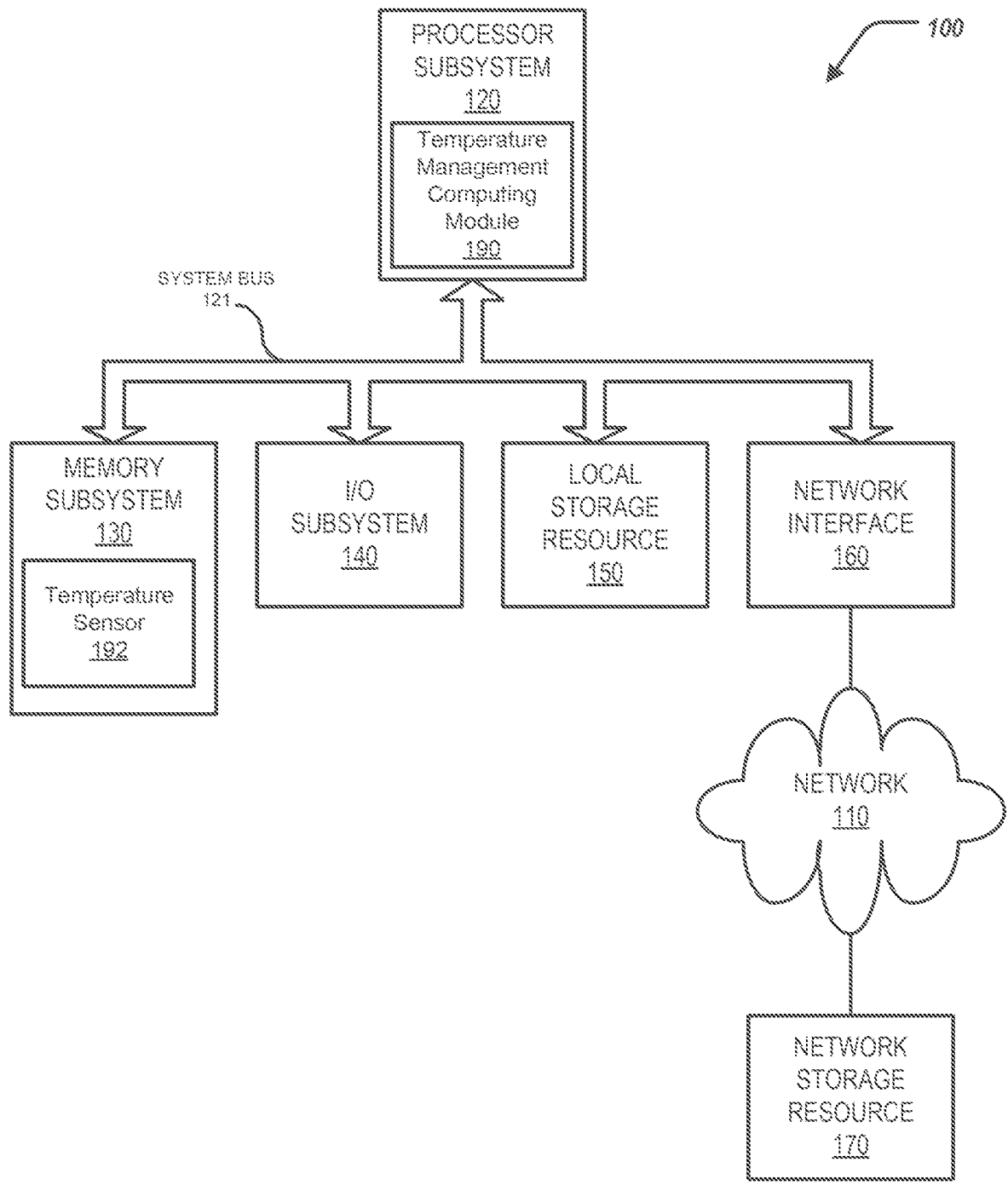
FIG. 1 is a block diagram of selected elements of an embodiment of an information handling system.

DESCRIPTION OF PARTICULAR
EMBODIMENT(S)

This disclosure discusses methods and systems for temperature management of memory elements of an information handling system. In short, sub-optimal operating conditions (operating temperatures) of a memory element can be detected and refresh commands (and/or interleaving activate/read/pre-charge commands) can be issued to the memory element in response. When the memory element performs these commands, the memory element can utilize energy, and generate heat, thus increasing a temperature of the memory element itself. These commands can be sent repeatedly until an appropriate operating temperature (or temperature range) of the memory element is obtained. Once the appropriate temperate of the memory element is obtained, the memory element can reliably store data and operate normally.

Specifically, this disclosure discusses a system and a method for managing a temperature of a memory element of an information handling system, the method comprising: identifying a temperature grade of the memory element, the temperature grade indicating at least a lower temperature boundary associated with the memory element; determining an initial temperature of the memory element; determining whether the initial temperature is less than the lower temperature boundary; in response to determining that the initial temperature is less than the lower temperature boundary: performing a series of repeated burst refresh operations at the memory element; after performing the series of repeated burst refreshes operations, determining an updated temperature of memory element; determining whether the updated temperature is less than the lower temperature boundary; and in response to determining that the updated temperature is greater than the lower temperature boundary, proceed with operating the memory element normally such as performing a normal boot of the information handling system.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 2:
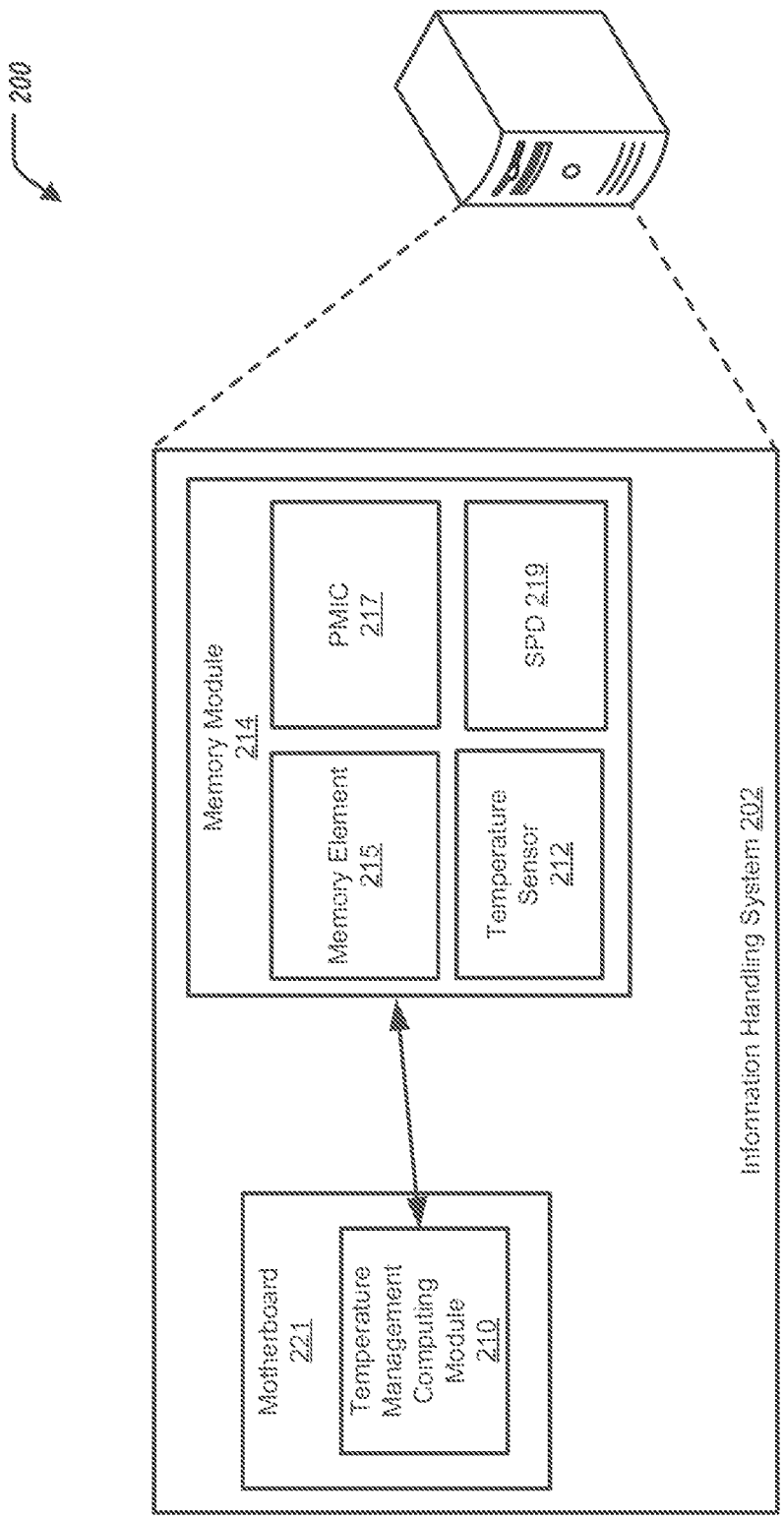
FIGS. 2, 4 illustrate respective block diagrams of an information handling system for temperature management of memory elements of the information handling system.
Figure 3:
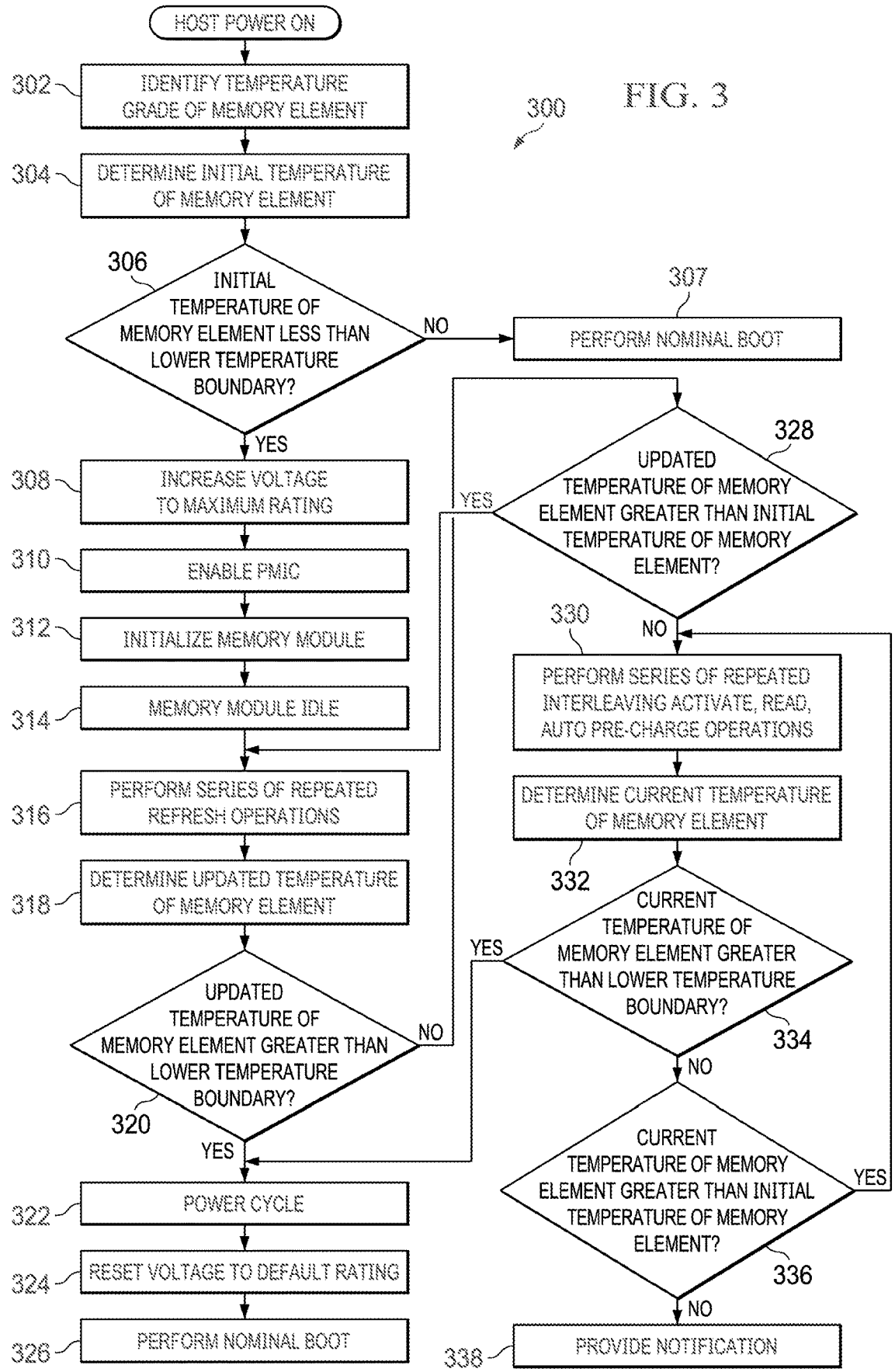
FIG. 3 illustrates a method for temperature management of memory elements of the information handling system.

Particular embodiments are best understood by reference to FIGS. 1-3 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a temperature management computing module 190. The temperature management computing module 190 can be included by the processor subsystem 120. In some examples, the temperature management computing module 190 is or is a component of a central processing unit (CPU), a baseband management controller (BMC), an embedded controller (EC), a microprocessor, a microcontroller, a digital signal processor (DSP), an application specific integrated circuit (ASIC), a field-programmable gate array (FPGA), or any combination thereof.

The information handling system 100 can further include a temperature sensor 192. The temperature sensor 192 can be included by the memory subsystem 130 and can determine a temperature of the memory subsystem 130, described further herein.

In short, sub-optimal operating conditions (operating temperatures) of a memory element (e.g., the memory subsystem 130) can be detected by the temperature management computing module 190 via reading a temperature reading of the temperature sensor 192. In response to detection of such operating conditions, refresh commands (and/or interleaving activate/read/pre-charge commands) can be actively issued to the memory element by the temperature management computing module 190. When the memory element performs these commands, the memory element can utilize energy, and generate heat, thus increasing a temperature of the memory element. These commands can be sent repeatedly by the temperature management computing module 190 until an appropriate operating temperature (or temperature range) of the memory element is obtained. Once the appropriate temperate of the memory element is obtained, the memory element can reliably store data and operate normally.

Turning to FIG. 2, FIG. 2 illustrates an environment 200 including an information handling system 202. The information handling system 202 can include a motherboard 221 and a memory module 214. The motherboard 221 can include a temperature management computing module 210. The memory module 214 can include a memory element 215, a temperature sensor 212, and a serial presence detect (SPD) 219. In some examples, the memory module 214 can further include a power management integrated circuit (PMIC) 217 (when the memory module 214 is a DDR5 DIMM). In some examples, the information handling system 202 is similar to, or includes, the information handling system 100 of FIG. 1. In some examples, the temperature management computing module 210 is the same, or substantially the same, as the temperature management computing module 190 of FIG. 1. In some examples, the temperature sensor 212 is the same, or substantially the same, as the temperature sensor 192 of FIG. 1. In some examples, the memory module 214 is the same, or substantially the same, as the memory subsystem 130 of FIG. 1.

The temperature management computing module 210 can be in communication with the memory module 214.

In some examples, the memory module 214 is a double data rate 4 (DDR4) dual in-line memory module (DIMM). In some examples, memory module 214 is a double data rate 5 (DDR5) dual in-line memory module (DIMM). In some examples, the memory element 215 is a dynamic random-access memory (DRAM).

Figure 4:
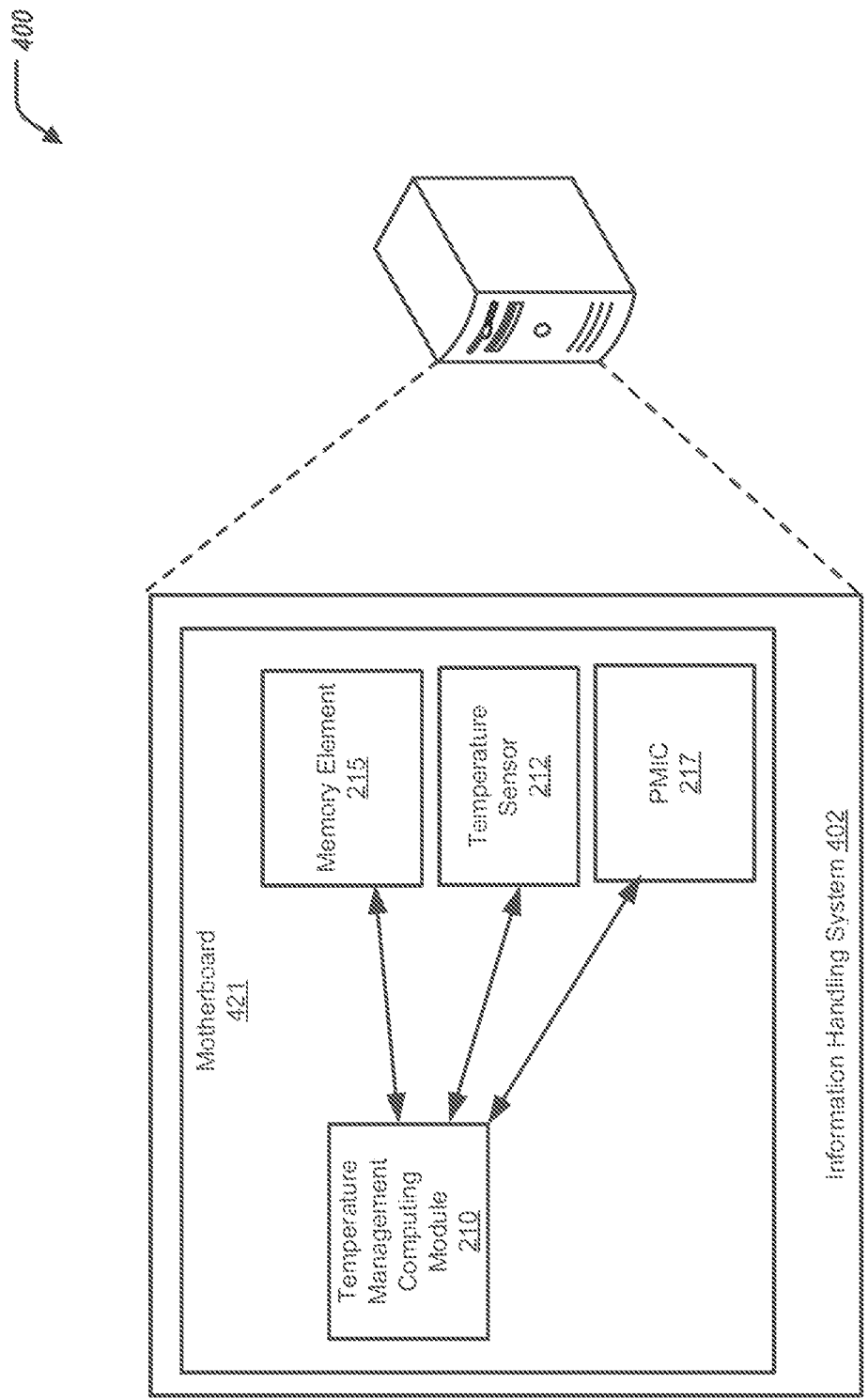

FIG. 4 illustrates an environment 400 including an information handling system 402. The information handling system 402 can include a motherboard 421. The motherboard 421 can include the temperature management computing module 210, the memory element 215, and the temperature sensor 212. In some examples, the motherboard 421 can further include a power management integrated circuit (PMIC) 217. In some examples, the information handling system 402 is similar to, or includes, the information handling system 100 of FIG. 1. In some examples, the temperature management computing module 210 is the same, or substantially the same, as the temperature management computing module 190 of FIG. 1. In some examples, the temperature sensor 212 is the same, or substantially the same, as the temperature sensor 192 of FIG. 1. In some examples, the memory element 215 is a dynamic random-access memory (DRAM).

The temperature management computing module 210 can be in communication with the memory element 215, the temperature sensor 212, and/or the PMIC 217.

FIG. 3 illustrates a flowchart depicting selected elements of an embodiment of a method 300 temperature management of memory modules of an information handling system. The method 300 may be performed by the information handling system 100, the information handling system 202, the information handling system 402, the temperature management computing module 210, the memory module 214, the memory element 215, and/or the temperature sensor 212, and with reference to FIGS. 1-2 and 4. It is noted that certain operations described in method 300 may be optional or may be rearranged in different embodiments.

The temperature management computing module 210 can identify (receive data indicating) a temperature grade of the memory element 215 (302). Specifically, the SPD 219 can store data indicating, or access such data, indicating the temperature grade of the memory element 215. The temperature grade (or temperature range) can indicate a lower temperature boundary associated with the memory element 215. In some cases, the temperature grade can further indicate an upper temperature boundary associated with the memory element 215. For example, the lower temperature boundary can be 0 degrees; and the upper temperature boundary can be 85 degrees Celsius. In some examples, the temperature grade can range from 0 to 95 degrees Celsius. In some examples, the SPD 219 can further indicate a capacity of the memory element 215, and/or a speed of the memory element 215.

The temperature management computing module 210 can determine an initial temperature of the memory element 215 (304). For example, the temperature sensor 212 can determine the initial temperature of the memory element 215, and provide such information to the temperature management computing module 210.

The temperature management computing module 210 determines whether the initial temperature is less than the lower temperature boundary (306). That is, the temperature management computing module 210 can compare the initial temperature of the memory element 215 with the lower temperature boundary. When the temperature management computing module 210 determines that the initial temperature of the memory element 215 is greater than the lower temperature boundary, the memory element 215 can operate normally and therefore perform a normal boot (307). When the temperature management computing module 210 determines that the initial temperature of the memory element 215 is less than the lower temperature boundary, the temperature management computing module 210 increases an input voltage to the memory element 215 to a maximum rating (308). For example, when the memory module 214 is a DDR5 DIMM, the memory module 214 can include power management integrated circuit (PMIC) 217. The voltage of the PMIC 217 can be increased to or close to the maximum rating allowed by the memory element 215. The temperature management computing module 210 enables the PMIC 217 (310).

In some cases, steps 308 and 310 are only performed when the memory module 214 is a DDR5 DIMM. That is, when the memory module 214 is a DDR4 DIMM, the method proceeds from step 306 to step 312 (when temperature management computing module 210 determines that the initial temperature of the memory element 215 is greater than the lower temperature boundary).

The temperature management computing module 210 facilitates performing an initialization of the memory module 214 (312). For example, such initialization of the memory module 214 can include initialization per Joint Electron Device Engineering Council (JEDEC) standards such as reset, wake, ZQ calibration, etc. The memory module 214 can become idle (314).

The temperature management computing module 210 can perform a series of repeated burst refresh operations at the memory element 215 (316). Specifically, by sending the series of repeated burst refresh operations to the memory element 215, the memory element 215 is reading the contents of its cell array and re-writing back to the cell array very quickly. The refresh command further loads the data to output from the memory element 215. By performing the series of repeated burst refresh operations at the memory element 215, the memory element 215 generates power draw, and ultimately, generates heat at the memory element 215. Thus, the memory element 215 is able to self-generate heat by performing a series of repeated burst refresh operations. In some examples, the memory element 215 can perform the series of repeated burst refresh operations for a predetermined period of time, e.g., 1 minute, 5 minutes, 10 minutes.

The temperature management computing module 210, after performing the series of repeated burst refresh operations (at the memory element 215), can determine an updated temperature of the memory element 215 (318). For example, the temperature sensor 212 can determine the updated temperature of the memory element 215, and provide such information to the temperature management computing module 210.

The temperature management computing module 210 determines whether the updated temperature is less than the lower temperature boundary (320). That is, the temperature management computing module 210 can compare the updated temperature of the memory element 215 with the lower temperature boundary. When the temperature management computing module 210 determines that the updated temperature of the memory element 215 is greater (or equal to) than the lower temperature boundary, the memory element 215 performs a host power cycle (322). Further, the voltages at the PMIC 217 are reset to a default rating (when the memory module 214 is a DDR DIMM) (324). The memory element 215 can operate normally and perform a normal boot (326). In some cases, steps 322 and 324 are only performed when the memory module 214 is a DDR5 DIMM. That is, when the memory module 214 is a DDR4 DIMM, the method proceeds from step 320 to step 326 (when temperature management computing module 210 determines that the updated temperature of the memory element 215 is greater than the lower temperature boundary).

When the temperature management computing module 210 determines that the updated temperature of the memory element 215 is less than the lower temperature boundary, the temperature management computing module 210 determines whether the updated temperature is greater than the initial temperature of the memory element 215 (328). That is, the temperature management computing module 210 can compare the updated temperature of the memory element 215 with the initial temperature of the memory element 214. When the temperature management computing module 210 determines that the updated temperature of the memory element 215 is greater than the initial temperate of the memory element 215, the method can proceed to step 316. That is, when the temperature management computing module 210 determines that the updated temperature of the memory element 215 is greater than the initial temperate of the memory element 215, the temperature management computing module 210 can perform a series of repeated burst refresh operations at the memory element 215. By performing the series of repeated burst refresh operations at the memory element 215, the memory element 215 generates power draw, and ultimately, generate heat at the memory element 215. Thus, the memory element 215 is able to self-generate heat by performing a series of repeated burst refresh operations. In some examples, the memory element 215 can perform the series of repeated burst refresh operations for a predetermined period of time, e.g., 1 minute, 5 minutes, 10 minutes.

When the temperature management computing module 210 determines that the updated temperature of the memory element 215 is the same (or less) as the initial temperature of the memory element 215, the temperature management computing module 210 can perform a series of repeated interleaving activate, read, and/or auto pre-charge operations at the memory element 215 (330). Specifically, by sending the repeated interleaving activate, read, and/or auto pre-charge operations to the memory element 215, the memory element 215 can generate power draw, and ultimately, generate heat at the memory element 215. Thus, the memory element 215 is able to self-generate heat by performing a series of repeated burst refresh operations. In some examples, the memory element 215 can perform the series of repeated burst refresh operations for a predetermined period of time, e.g., 1 minute, 5 minutes, 10 minutes.

After performing the series of repeated burst refresh operations (at the memory element 215), the temperature management computing module 210 can determine a current temperature of the memory element 215 (332). For example, the temperature sensor 212 can determine the current temperature of the memory element 215, and provide such information to the temperature management computing module 210.

The temperature management computing module 210 determines whether the current temperature is less than the lower temperature boundary (334). That is, the temperature management computing module 210 can compare the current temperature of the memory element 215 with the lower temperature boundary. When the temperature management computing module 210 determines that the current temperature of the memory element 215 is greater (or equal to) than the lower temperature boundary, the method can proceed to step 322. That is, when the temperature management computing module 210 determines that the current temperature of the memory element 215 is greater than the lower temperature boundary, the memory element 215 performs a host power cycle (322). Further, the voltage at the PMIC 217 is reset to a default rating (324). The memory element 215 can operate normally and perform a normal boot (326).

When the temperature management computing module 210 determines that the current temperature of the memory element 215 is less than the lower temperature boundary, the temperature management computing module 210 determines whether the current temperature is greater than the initial temperature of the memory element 215 (336). That is, the temperature management computing module 210 can compare the current temperature of the memory element 215 with the initial temperature of the memory element 215. When the temperature management computing module 210 determines that the current temperature of the memory element 215 is greater than the initial temperature of the memory element 215, the method proceeds to step 330. That is, when the temperature management computing module 210 determines that the current temperature of the memory element 215 is greater than the initial temperature of the memory element 215, the temperature management computing module 210 can perform a series of repeated interleaving activate, read, and/or auto pre-charge operations at the memory element 215. Specifically, by sending the repeated interleaving activate, read, and/or auto pre-charge operations to the memory element 215, the memory element 215 can generate power draw, and ultimately, generate heat at the memory element 215. Thus, the memory element 215 is able to self-generate heat by performing a series of repeated burst refresh operations. In some examples, the memory element 215 can perform the series of repeated burst refresh operations for a predetermined period of time, e.g., 1 minute, 5 minutes, 10 minutes.

When the temperature management computing module 210 determines that the current temperature of the memory element 215 is less than the initial temperature of the memory element 215, the temperature management computing module 210 can provide a notification (e.g., a visual notification on a display device associated with the information handling system 202, or a third party device in communication with the information handling system 202) indicating a failed status of the memory element 215. For example, the failed status can indicate that a failure to obtain an appropriate operating temperature of the memory element 215.

In some examples, when the temperature management computing module 210 determines that the updated temperature of the memory element 215 is greater than the initial temperature of the memory element 215 (at 328), the temperature management computing module 210 can determine that the updated temperature of the memory element 215 is not greater than the lower temperature boundary within a time threshold. When the temperature management computing module 210 determines such, the temperature management computing module 210 can provide a notification (e.g., a visual notification on a display device associated with the information handling system 202, or a third party device in communication with the information handling system 202) indicating a failed status of the memory element 215. For example, the failed status can indicate that a failure to obtain an appropriate operating temperature of the memory element 215 with a time period or time threshold.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A computer-implemented method of managing a temperature of a memory element of an information handling system, the method comprising:
   identifying a lower temperature boundary of the memory element;
   determining an initial temperature of the memory element;
   determining whether the initial temperature is less than the lower temperature boundary;
   in response to determining that the initial temperature is less than the lower temperature boundary:
      performing a series of repeated burst refresh operations at the memory element to generate heat at the memory element;
      after performing the series of repeated burst refreshes operations, determining an updated temperature of the memory element in response to the generated heat;
      determining whether the updated temperature is less than the lower temperature boundary;
      in response to determining that the updated temperature is greater than the lower temperature boundary, operating the memory element normally and performing a normal boot of the memory element;
      in response to determining that the updated temperature is less than the lower temperature boundary, determining whether the updated temperature is greater than the initial temperature; and
      in response to determining that the updated temperature is the same as the initial temperature, performing a series of repeated interleaving activate, read, auto pre-charge operations at the memory element.

2. The computer-implemented method of claim 1, further comprising:
   in response to determining that that initial temperature is greater than the lower temperature boundary, operating the memory element normally and performing the normal boot of the memory element.

3. The computer-implemented method of claim 1, further in response to determining that the initial temperature is less than the lower temperature boundary:
   increasing an input voltage to the memory element to a maximum rating; and
   enabling a power management integrated controller based on the increased input voltage.

4. The computer-implemented method of claim 1, further in response to determining that the updated temperature is greater than the lower temperature boundary:
   resetting the voltage to the memory element to a default rating of the memory element.

5. The computer-implemented method of claim 1, further in response to determining that the initial temperature is less than the lower temperature boundary:
   performing an initialization of the memory element.

6. The computer-implemented method of claim 1, further in response to determining that the initial temperature is less than the lower temperature boundary:
   in response to determining that the updated temperature is less than the lower temperature boundary, determining whether the updated temperature is greater than the initial temperature; and
   in response to determining that the updated temperature is greater than the initial temperature, performing the series of repeated burst refreshes operations at the memory element a second time.

7. The computer-implemented method of claim 1, further in response to determining that the updated temperature is the same as the initial temperature:
   determining a current temperature of the memory element;
   determining whether the current temperature is less than the lower temperature boundary; and
   in response to determining that the current temperature is greater than the lower temperature boundary, operating the memory element normally and performing the normal boot of the memory element.

8. The computer-implemented method of claim 7, further comprising:

in response to determining that the current temperature is less than the lower temperature boundary, provide a notification indicating a failed status of memory element.

9. An information handling system comprising a processor having access to non-transitory memory media storing instructions executable by the processor to perform operations, comprising:
  identifying a lower temperature boundary of the memory element;
  determining an initial temperature of the memory element;
  determining whether the initial temperature is less than the lower temperature boundary;
  in response to determining that the initial temperature is less than the lower temperature boundary:
    performing a series of repeated burst refresh operations at the memory element to generate heat at the memory element;
    after performing the series of repeated burst refreshes operations, determining an updated temperature of the memory element in response to the generated heat;
    determining whether the updated temperature is less than the lower temperature boundary;
    in response to determining that the updated temperature is greater than the lower temperature boundary, operating the memory element normally and performing a normal boot of the memory element;
    in response to determining that the updated temperature is less than the lower temperature boundary, determining whether the updated temperature is greater than the initial temperature; and
    in response to determining that the updated temperature is the same as the initial temperature, performing a series of repeated interleaving activate, read, auto pre-charge operations at the memory element.

10. The information handling system of claim 9, the operations further comprising:
  in response to determining that that initial temperature is greater than the lower temperature boundary, operating the memory element normally and performing the normal boot of the memory element.

11. The information handling system of claim 9, further in response to determining that the initial temperature is less than the lower temperature boundary, the operations further comprising:
  increasing an input voltage to the memory element to a maximum rating; and
  enabling a power management integrated controller based on the increased input voltage.

12. The information handling system of claim 9, further in response to determining that the updated temperature is greater than the lower temperature boundary, the operations further comprising:
  resetting the voltage to the memory element to a default rating of the memory element.

13. The information handling system of claim 9, further in response to determining that the initial temperature is less than the lower temperature boundary, the operations further comprising:
  performing an initialization of the memory element.

14. The information handling system of claim 9, further in response to determining that the initial temperature is less than the lower temperature boundary, the operations further comprising:
  in response to determining that the updated temperature is less than the lower temperature boundary, determining whether the updated temperature is greater than the initial temperature; and
  in response to determining that the updated temperature is greater than the initial temperature, performing the series of repeated burst refreshes operations at the memory element a second time.

15. The information handling system of claim 9, further in response to determining that the updated temperature is the same as the initial temperature, the operations further comprising:
  determining a current temperature of the memory element;
  determining whether the current temperature is less than the lower temperature boundary; and
  in response to determining that the current temperature is greater than the lower temperature boundary, operating the memory element normally and performing the normal boot of the memory element.

16. The information handling system of claim 9, the operations further comprising further comprising:
  in response to determining that the current temperature is less than the lower temperature boundary, provide a notification indicating a failed status of memory element.

17. A non-transitory computer-readable medium storing software comprising instructions executable by one or more computers which, upon such execution, cause the one or more computers to perform operations comprising:
  identifying a lower temperature boundary of the memory element;
  determining an initial temperature of the memory element;
  determining whether the initial temperature is less than the lower temperature boundary;
  in response to determining that the initial temperature is less than the lower temperature boundary:
    performing a series of repeated burst refresh operations at the memory element to generate heat at the memory element;
    after performing the series of repeated burst refreshes operations, determining an updated temperature of memory element in response to the generated heat;
    determining whether the updated temperature is less than the lower temperature boundary; and
    in response to determining that the updated temperature is greater than the lower temperature boundary, operating the memory element normally and performing a normal boot of the memory element;
    in response to determining that the updated temperature is less than the lower temperature boundary, determining whether the updated temperature is greater than the initial temperature; and
    in response to determining that the updated temperature is the same as the initial temperature, performing a series of repeated interleaving activate, read, auto pre-charge operations at the memory element.

18. The non-transitory computer-readable medium of claim 17, the operations further comprising:
  in response to determining that that initial temperature is greater than the lower temperature boundary, operating the memory element normally and performing the normal boot of the memory element.

* * * * *